United States Patent
Yang et al.

(10) Patent No.: US 9,706,621 B2
(45) Date of Patent: Jul. 11, 2017

(54) MULTI-STANDARD LIGHTING CONTROL INTERFACE CIRCUIT

(71) Applicants: Sivakumar Thangavelu, Billerica, MA (US); Michael Ardai, Malden, MA (US)

(72) Inventors: Lin Yang, Lynnfield, MA (US); Sivakumar Thangavelu, Billerica, MA (US); Michael Ardai, Malden, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 909 days.

(21) Appl. No.: 13/967,385

(22) Filed: Aug. 15, 2013

(65) Prior Publication Data
US 2015/0048762 A1 Feb. 19, 2015

(51) Int. Cl.
*B23K 11/24* (2006.01)
*H05B 37/02* (2006.01)
*H03K 19/0175* (2006.01)

(52) U.S. Cl.
CPC ..... *H05B 37/02* (2013.01); *H03K 19/017536* (2013.01); *H05B 37/0245* (2013.01)

(58) Field of Classification Search
CPC .................. H03K 19/017536; H05B 37/0254
USPC ..... 700/286, 275, 3, 276; 348/135; 315/158, 315/291, 292
See application file for complete search history.

(56) References Cited

U.S. PATENT DOCUMENTS

| 6,980,023 | B1 | 12/2005 | Wong et al. |
| 2002/0158591 | A1* | 10/2002 | Ribarich ............ H05B 37/0254 315/291 |
| 2006/0022214 | A1 | 2/2006 | Morgan et al. |

OTHER PUBLICATIONS

Villafuerte Abrego, International Search Report and Written Opinion of the International Searching Authority for PCT/US2014/050646, Oct. 20, 2014, pp. 1-6, European Patent Office, Rijswijk, The Netherlands.

* cited by examiner

*Primary Examiner* — Arnold Kinkead
(74) *Attorney, Agent, or Firm* — Shaun P. Montana

(57) ABSTRACT

Lighting control interface techniques and corresponding circuitry are provided. The techniques include receiving a first signal potentially representative of a first lighting control signal, and receiving a second signal potentially representative of a second lighting control signal, and determining if either of the first and second signals complies with a first or second lighting control protocol. The lighting control signal may be applied to the same interface connector (regardless of the protocol), thereby eliminating the need for separate dedicated interface connectors. In some cases, the techniques further include determining that a dummy control signal is manifesting in the first and/or second signals, thereby indicating that no lighting control signal is being applied. Depending on the resulting determination, the techniques may include, for example, setting output lighting power according to a pre-established value, or according to the first or second lighting control protocol.

17 Claims, 7 Drawing Sheets

MULTI-STANDARD LIGHTING CONTROL INTERFACE CIRCUIT

TECHNICAL FIELD

The present invention relates to lighting, and more specifically, to lighting control interface circuits.

BACKGROUND

There are a number of lighting control standards currently available for use by lighting products. For example, DALI (Digital Addressable Lighting Interface) and 0 to 10V are two commonly used lighting control standards. While a DALI compliant control signal is digital, a 0-10V compliant control signal is analog. A DALI interface is bidirectional and is specified in IEC standard 62386. The high level of a DALI-compliant control signal is 9.5 to 22.5V (typical 16 V), and the low level is −6.5 to 6.5V (typical 0V). A lighting control device, such as a ballast or a solid state light source driver, as a DALI slave component, may consume only 2.0 mA or less from the DALI interface. A DALI interface works with a non-reversed or a reversed DALI signal connection. In contrast, a 0-10V control signal is a DC voltage that varies between 0 and 10 VDC to produce a varying light intensity level. There are two existing 0-10V standards, one of which is for current sourcing controls and is supported by the standard ESTA E1.3, Entertainment Technology—Lighting Control System—0-10V Analog Control Protocol, Draft 9 Jun. 1997. The other available 0-10V standard is for current sink controls, which is specified in IEC standard 60929 Annex E.

SUMMARY

There are a number of non-trivial issues associated with complying with the various available lighting control protocols. For instance, in some cases where the lighting control interface is to support multiple standards such as DALI, 0-10V (current sink or source), and/or other such lighting protocols, a separate interface is required for each such protocol, thereby requiring a distinct or otherwise dedicated interface connector for each protocol. Such connectors and the associated fabrication costs are relatively expensive and also take up a significant amount of physical space per connector. In addition, while some requirements apply to multiple standards, other requirements are unique to a given standard and do not apply to other standards. As such, an interface circuit that works for one standard would not necessarily be appropriate for another standard.

Thus, embodiments provide a lighting control interface circuit that receives control signals from multiple standards at a common connector (e.g., the same two terminals or contact pads of a single connector). The interface circuit provides a first protocol output and a second protocol output. These outputs may be digital, analog or a combination. For instance, the first protocol output could be an analog output for 0-10V compliant signals and the second protocol output could be a digital output for DALI compliant signals. A microcontroller unit (MCU) or other suitable processor receives the various outputs of the interface circuit and recognizes the existence of the respective protocols (e.g., DALI digital signal, 0-10V analog signal, etc), and then processes the control signal accordingly. The MCU also detects if no control signal is connected to the interface circuit. In some embodiments, the interface circuit includes a common connector operatively coupled to a first protocol signal processing section which is in turn operatively coupled to a second protocol signal processing section. In such embodiments, the first protocol signal processing section effectively passes through a signal having a second protocol. Thus, if a second protocol signal is applied to the interface, the MCU/processor will assess how that signal manifests at the output of the first protocol signal processing section as well as at the output of the second protocol signal processing section, and is configured to determine that the output of the second protocol signal processing section is the most correct choice and will power a ballast/driver circuit connected thereto in accordance with that output/protocol, and will ignore the output of the first protocol signal processing section. In a similar fashion, if a first protocol signal is applied to the interface, the MCU/processor will assess how that signal manifests at the output of the first protocol signal processing section as well as at the output of the second protocol signal processing section, and is configured to determine that the output of the first protocol signal processing section is the most correct choice and that the output of the second protocol signal processing section should be ignored.

In some embodiments, the interface circuit is configured to operate with both DALI and 0-10V control signals using the same two connectors. In some such embodiments, the 0-10V protocol section is implemented at the front end of the interface circuit and is configured with a differential amplifier and a linear opto-isolation amplifier to provide the analog 0-10V output and for galvanic isolation. The DALI protocol section is implemented at the output of 0-10V protocol section and is configured with a translation sub-circuit to provide the digital DALI output. The MCU or other processor connected to the respective outputs of the 0-10V and DALI protocol sections may recognize the existence of the DALI digital control signal or the 0-10V analog control signal. Note that any changes made to a DALI signal caused by processing through the 0-10V protocol section may be recognized and corrected or otherwise compensated for by the processor. The processor may then process the lighting control signal accordingly.

In some embodiments, and with respect to recognizing that no control signal is connected, the interface circuit may include an on-board signal generator sub-circuit configured to apply a signal to the input terminals. In such embodiments, if no control signal is connected to the common connector terminals, the output of the interface circuit will resemble or otherwise indicate the signal produced by the signal generator sub-circuit. On the other hand, if a lighting control signal complying with a given protocol is connected to the common connector terminals, the signal produced by the signal generator sub-circuit is effectively suppressed and the output of the interface circuit will resemble or otherwise indicate the protocol of the applied lighting control signal. In one such embodiment, for example, a 0-10V lighting controller that has relatively low output impedance compared to the output impedance of the signal generator sub-circuit (in some embodiments) is connected to the interface. As such, the signal output by the signal generator sub-circuit is effectively suppressed by the applied 0-10V control signal. A similar suppression of the signal produced by the signal generator sub-circuit occurs if a DALI lighting controller is present at the input. An MCU or other processor may be programmed or otherwise configured to identify a given control signal type by parameters indicative of that protocol or the signal output by the signal generator sub-circuit by parameters indicative of that signal, and drive the ballast/light circuit accordingly. Any one or more standards-based processing sections may be used in conjunction with such a signal generator sub-circuit, wherein the signal generator sub-circuit allows the condition of no control signal at the interface input to be recognized.

The interface circuit may be configured with other features or functionality. For instance, the interface circuit may also be configured to recognize the conditions of input signal polarity reverse and/or signal level. The interface circuit may also be configured to withstand a wide voltage range at its input. In some embodiments, the interface circuit may withstand voltage between −20 VDC and +20 VDC. The circuit may also be configured to withstand high AC voltage at its input, such as 120 VAC. In some embodiments, the interface circuit is configured with an isolated DC/DC converter and opto-isolation amplifier, so as to provide isolation of control signals from AC mains (line and neutral). Numerous other features and functionality will be apparent in light of this disclosure and may depend on various factors such as, for example but not limited to, applicable lighting standards/protocols, desired lighting performance, and/or existing lighting infrastructure.

In an embodiment, there is provided a lighting control interface circuit. The lighting control interface circuit includes: an interface connector configured to receive a lighting control signal; a control signal processing circuit operatively coupled to the interface connector and having a first processing section that provides a first output signal at a first output; and a processor configured to receive the first output signal via the first output and to determine if a lighting control signal is being applied at the interface connector based on the first output signal.

In a related embodiment, the processor may be further configured to determine if a lighting control signal applied at the interface connector complies with one of a first lighting control protocol and a second lighting control protocol. In another related embodiment, the lighting control interface circuit may further include a signal generator circuit operatively coupled to the interface connector and configured to provide a dummy control signal at an output of the control signal processing circuit as an indicator to the processor that no lighting control signal is currently applied to the interface connector. In a further related embodiment, the processor may be further configured to detect the dummy control signal at an output of the control signal processing circuit. In another further related embodiment, a lighting control signal applied to the interface connector may override the dummy control signal. In yet another further related embodiment, the processor may be configured to detect the dummy control signal at the first output when no lighting control signal is applied to the interface connector.

In still another related embodiment, the control signal processing circuit may further include a second processing section operatively coupled to the first output and configured to provide a second output signal at a second output. In a further related embodiment, the processor may be further configured to receive the second output signal and to determine if the second output signal complies with a lighting control protocol in a plurality of lighting control protocols.

In yet another related embodiment, the first processing section may include an isolation amplifier, and the lighting control interface circuit may further include an isolated power supply configured to provide power to one side of the isolation amplifier. In still another related embodiment, the lighting control interface circuit may further include a transmitter communicatively coupled between the processor and the interface connector, and configured to allow the processor to communicate with a lighting controller connected to the interface connector.

In another embodiment, there is provided a lighting control interface circuit. The lighting control interface circuit includes: an interface connector configured to receive a lighting control signal that is compliant with a lighting control protocol in a plurality of lighting control protocols; a control signal processing circuit operatively coupled to the interface connector, wherein the control signal processing circuit comprises an isolation amplifier configured to provide a first output signal at a first output, and a signal translator operatively coupled to the first output and configured to provide a second output signal at a second output; and a processor configured to receive the first and second output signals and to determine if a lighting control signal applied at the interface connector complies with a lighting control protocol in the plurality of lighting control protocols.

In a related embodiment, the lighting control interface circuit may further include: a signal generator circuit operatively coupled to the interface connector and configured to provide a dummy control signal at an output of the control signal processing circuit as an indicator to the processor that no lighting control signal is currently applied to the interface connector. In a further related embodiment, the processor may be further configured to detect the dummy control signal at an output of the control signal processing circuit. In another further related embodiment, the processor may be configured to detect the dummy control signal at the first output when no lighting control signal is applied to the interface connector.

In yet another related embodiment, the lighting control interface circuit may further include at least one of: an isolated power supply configured to provide power to one side of the isolation amplifier; and a transmitter communicatively coupled between the processor and the interface connector configured to allow the processor to communicate with a lighting controller connected to the interface connector.

In another embodiment, there is provided a method of interfacing lighting controls. The method includes: receiving a first signal potentially representative of a first lighting control signal; receiving a second signal potentially representative of a second lighting control signal; and determining if either of the first and second signals complies with a first lighting control protocol or a second lighting control protocol.

In a related embodiment, the method may further include: determining that a dummy control signal is manifesting in at least one of the first and second signals, thereby indicating that no lighting control signal is being applied. In a further related embodiment, in response to determining that a dummy control signal is manifesting in at least one of the first and second signals, the method may further include setting output lighting power according to a pre-established value.

In another related embodiment, in response to determining the first signal complies with a first lighting control protocol, the method may further include setting output lighting power according to the first lighting control protocol. In yet another related embodiment, in response to determining the second signal complies with a second lighting control protocol, the method may further include setting output lighting power according to the second lighting control protocol.

BRIEF DESCRIPTION OF THE DRAWINGS

The foregoing and other objects, features and advantages disclosed herein will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

DETAILED DESCRIPTION

Figure 1A:
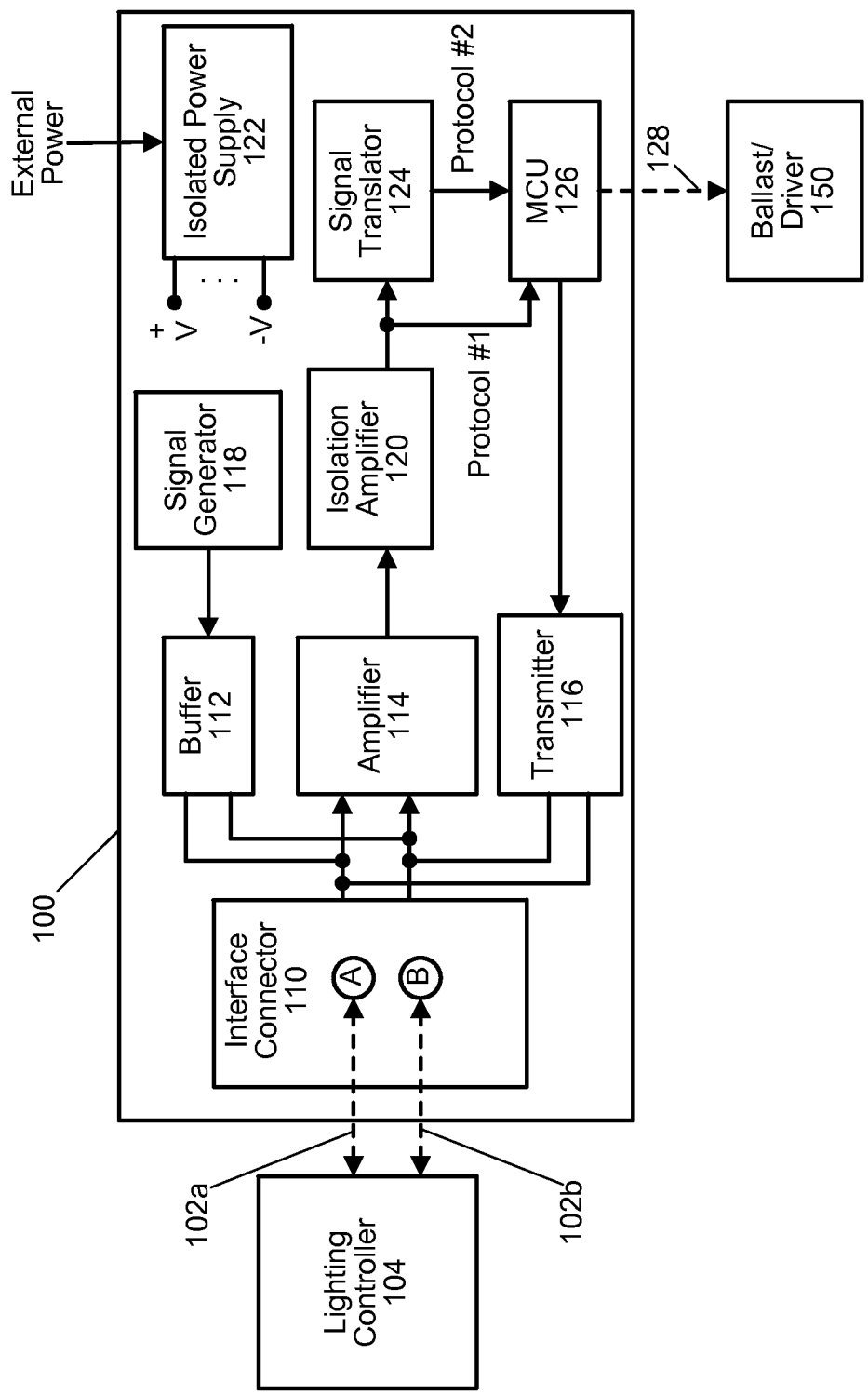
FIGS. 1A and 1B each illustrate a block diagram of a lighting control interface circuit according to embodiments disclosed herein.

FIG. 1A illustrates a block diagram of a lighting control interface circuit 100 (also referred to throughout as an interface circuit 100), which includes an interface connector 110, a buffer 112, an amplifier 114, a signal generator 118, an isolation amplifier 120, an isolated power supply 122, a signal translator 124, and an MCU 126. The lighting control interface circuit 100, in some embodiments, is, after the interface connector 110, divided into a first protocol section (also referred to as a front end and/or front end section) and a second protocol section. The first protocol section includes the amplifier 114 and the isolation amplifier 120. The second protocol section includes the signal translator 124. In some embodiments, one section or the other includes one or more of the remaining components (i.e., the buffer 112, the signal generator 118, the isolated power supply 122, the transmitter 116, and/or the MCU 126). In some embodiments, one or more of these components may be spread across both sections, or in their own section. The interface circuit 100 is able to receive a control signal (such as but not limited to at least one of the control signals 102a, 102b shown in FIG. 1A) from a lighting controller 104. The interface circuit 100 determines which one of multiple lighting control protocols applies to the received control signal 102a, 102b. Note that regardless of the protocol being used to transmit the control signal from the lighting controller 104 to the interface circuit 100, the control signal is applied to the same interface connector 110, which in FIG. 1A includes two terminals A and B. Though FIG. 1A shows the interface circuit 100 as working with two protocols, any number of protocols may be, and in some embodiments are, used, so long as the corresponding protocol of a control signal applied at the common interface connector 110 is able to be identified. The lighting control interface circuit 100 is also able to detect a no control signal condition at the common interface connector 110.

The isolated power supply 122 provides power to the various sub-circuits and/or components of the interface circuit 100. The amplifier 114 is operatively connected to the two terminals A and B of the interface connector 110. An output of the amplifier 114 is provided to an isolation amplifier 120, which in turn drives a signal translator 124. An output signal associated with a first lighting protocol, protocol #1 in FIG. 1A, is taken at the output of the isolation amplifier 120, and an output signal associated with a second lighting protocol, protocol #2 in FIG. 1A, is taken at the output of the signal translator 124. An MCU 126 receives both of these outputs, evaluates the received signals, and generates an appropriate drive signal 128. The drive signal 128 is then applied to a ballast/driver 150, which provides appropriate power to a lighting circuit connected thereto (not shown in FIG. 1A). The ballast/driver 150 is any type of ballast and/or driver circuit known in the art. The interface circuit 100 also includes the signal generator 118 and the buffer 112 for providing a dummy control signal to one or both of the two terminals A and B, thereby allowing for a no control signal situation to be detected. The interface circuit 100 also includes an optional transmitter 116 for providing communications from the MCU 126 back to the interface connector 110, and specifically back to one or both of the two terminals A and B, thereby allowing for bi-directional communication between the interface connector 110 and the MCU 126, which is used and/or required by some lighting standards.

Figure 1B:
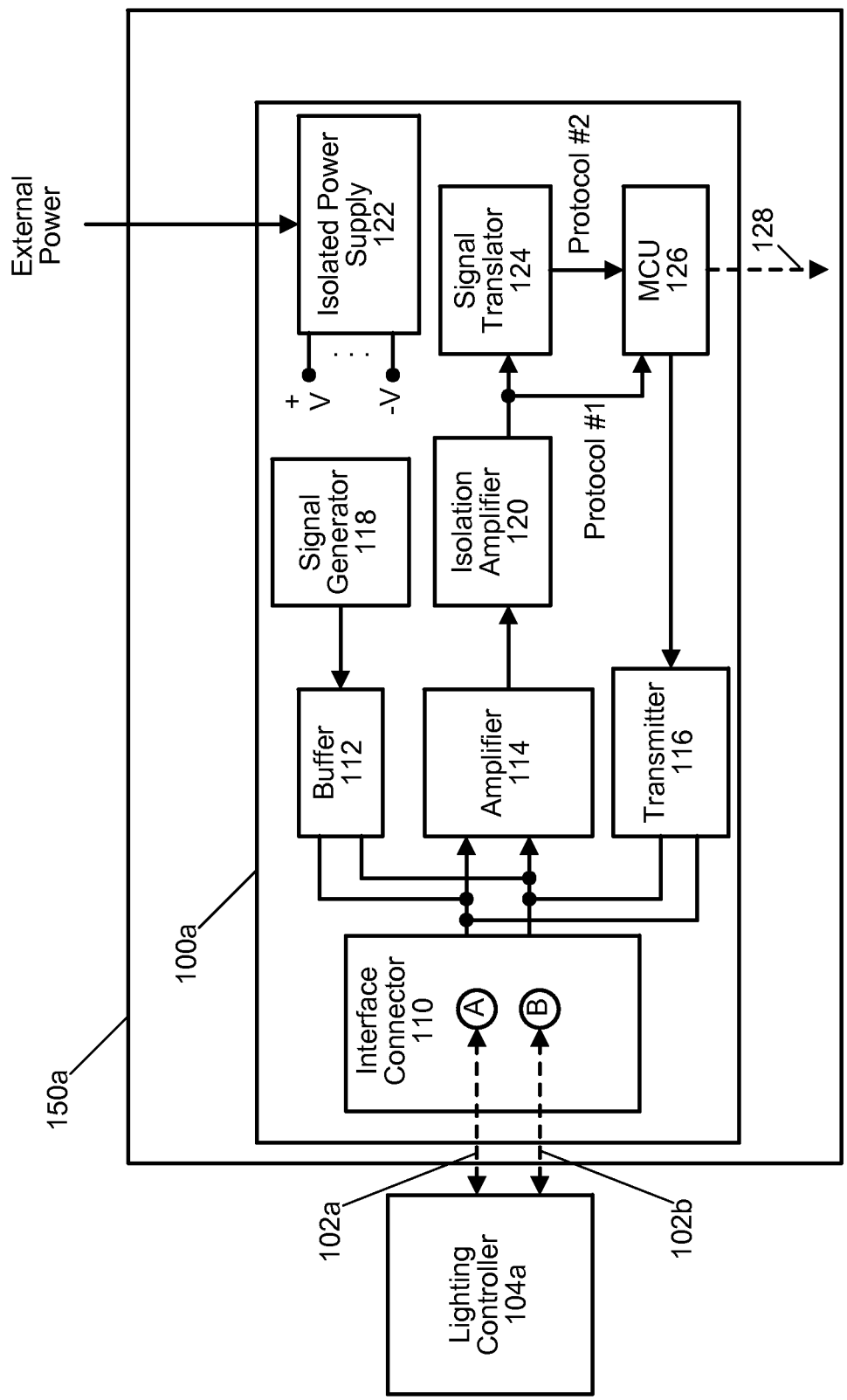

FIG. 1B shows another embodiment of a lighting control interface circuit 100a (also referred to throughout as an interface circuit 100a), having some similar components to lighting control interface circuit 100 shown in FIG. 1A. In FIG. 1B, the lighting control interface circuit 100a is integrated directly into a ballast/driver 150a and receives signals from a lighting controller 104a, which in some embodiments is not integrated with the ballast/driver 150a, and in some embodiments is. Other such integration schemes will be apparent in light of this disclosure. Components of the interface circuit 100/the interface circuit 100a will now be discussed in turn. For ease of description, these components will be discussed in terms of a first lighting protocol, i.e., protocol #1 in FIGS. 1A and 1B, being the 0-10V standard and a second lighting protocol, i.e. protocol #2 in FIGS. 1A and 1B, being the DALI standard. In such embodiments, the lighting controller 104/the lighting controller 104a may be, for example but not limited to, a 0-10V dimmer, a DALI master controller, both, or other similar components. Of course, embodiments are not so limited and thus may and do use different lighting control protocols and/or lighting controller(s). Similarly, the interface connector 110 may be, and in some embodiments is, any standard or custom interface connector suitable for the protocols to be supported, and may, and in some embodiments does, include any number of terminals and/or other contacts needed to communicate the signal(s) of a given standard/protocol. As will be appreciated in light of this disclosure, and in some embodiments, a control signal compliant with a given one of various standards supported by the interface circuit is able to be applied to the same interface connector 110 as control signals compliant with others of the various standards, thereby eliminating the need for multiple interface connectors. Thus, while the interface connector 110 shown in FIGS. 1A and 1B includes two terminals A and B, other embodiments may and do include an interface connector having any number of terminals, such as but not limited to a single terminal for +V with a connector plug casing for −V, or three terminals that allow for +V, −V, and a dedicated communication channel, respectively, and so on. Further, the interface connector 110 may and does take any number of form factors and thus may and does include, for example but not limited to, a plug/receptacle arrangement and/or wires directly soldered to corresponding conductors on a substrate, such as but not limited to a printed wiring board (PWB). The corresponding conductors to which the wires are soldered may be, for instance, conductive pads or vias, or conductive runs or posts. In some embodiments, the interface connector is configured to wirelessly receive lighting control signals, in which embodiments the interface connector includes appropriate transmission and reception components, such as but not limited to an antenna and receiver, transceiver, and the like, including combinations thereof, configured to receive lighting control signals of multiple protocols (e.g., rather than using a single physical interface connector to receive multiple protocols, a single wireless interface connector may be used). Thus, an interface connector is any wired or wireless input port for coupling a control signal into the interface circuit, wherein the input port is singular in nature and may receive multiple control signal types thereby eliminating or otherwise reducing the need for a dedicated input port for each signal type.

Figure 2:
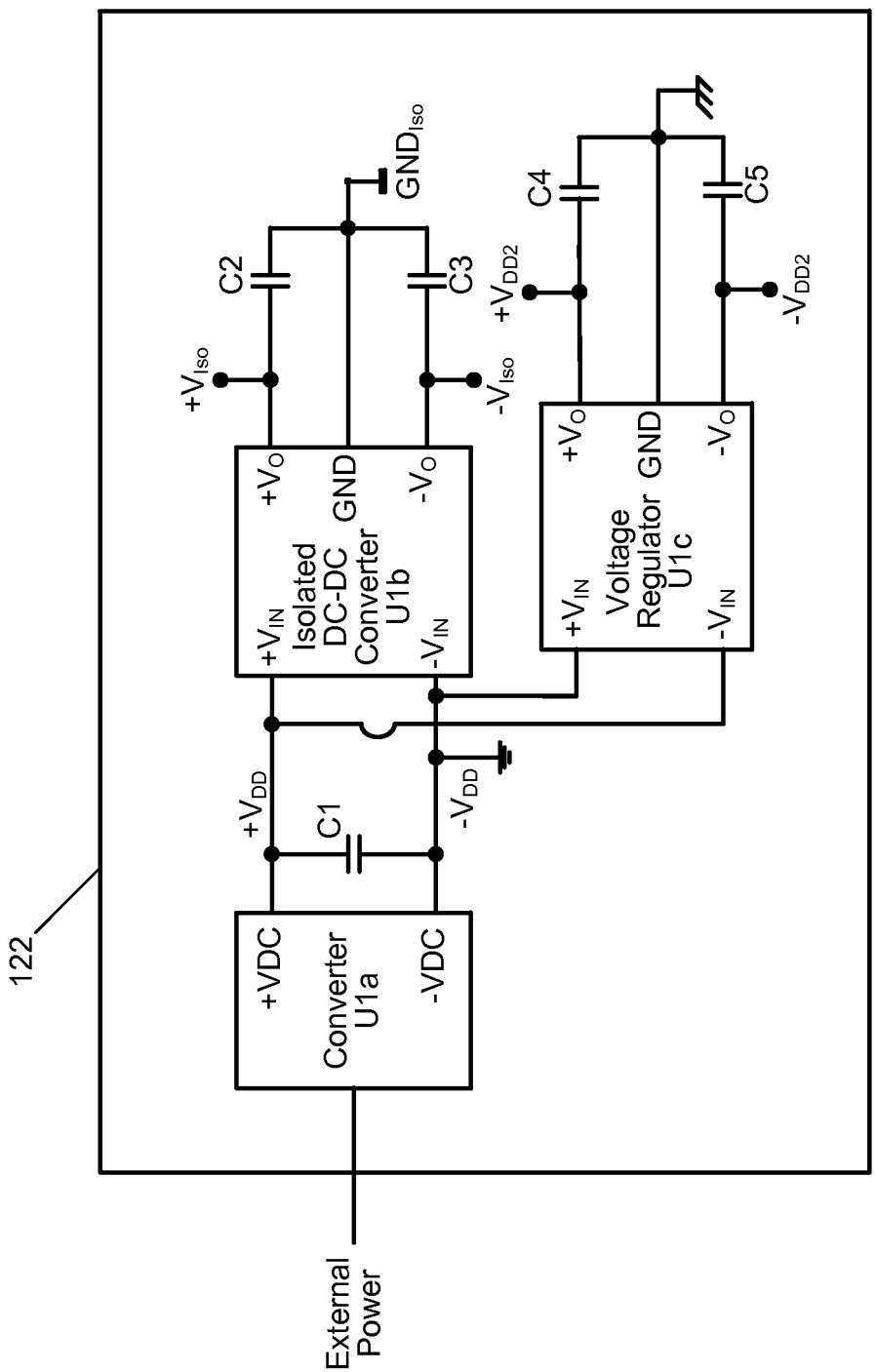
FIG. 2 illustrates an example configuration of an isolated power supply of the lighting control interface circuits of FIGS. 1A and 1B according to embodiments disclosed herein.

In operation, the isolated power supply 122 receives external power (e.g., 120 VAC @60 Hz, or 380 VDC, or any other AC or DC voltage source), and generates any supply voltages needed to operate the interface circuit 100/100a. In some embodiments, at least one of the generated voltages is isolated from the external power. The isolated power supply 122 may be configured in any number of ways. In some embodiments, the isolated power supply 122 is configured as shown in FIG. 2. In FIG. 2, the isolated power supply 122 includes a converter U1a for converting the external power to a first internal supply $+V_{DD}$, $-V_{DD}$, and an isolated DC-DC converter U1b for converting the first internal supply to a second internal supply $+V_{Iso}$, $-V_{Iso}$ that is isolated from the source of the external power. The first internal supply $+V_{DD}$, $-V_{DD}$ may be, and in some embodiments is, also converted to a third internal supply $+V_{DD2}$, $-V_{DD2}$, which may or may not be isolated. Alternatively, in some embodiments where only the first internal supply $+V_{DD}$, $-V_{DD}$ is needed, no third internal supply need be generated. As shown in FIG. 2, the first internal supply $+V_{DD}$, $-V_{DD}$ and the second internal supply $+V_{Iso}$, $-V_{Iso}$ are bipolar, but in other embodiments, either or both may be unipolar. Due to the isolation amplifier 120, at least two supplies are provisioned: one for the input side of the isolation amplifier 120 and related components, and one for the output side of the isolation amplifier 120 and related components. In some embodiments, each of the amplifier 114, an input side of the isolation amplifier 120, the buffer 112, the signal generator 118, and an output side of the transmitter 116 are powered by an isolated power source, such as but not limited to the second internal supply $+V_{Iso}$, $-V_{Iso}$ of the isolated power supply 122, and corresponding ground, such as but not limited to $GND_{Iso}$ of the isolated power supply 122. At the same time, an output side of the isolation amplifier 120, the signal translator 124, an input side of the transmitter 116, and the MCU 126 are powered by another power source, such as but not limited to the first internal power supply $+V_{DD}$, $-V_{DD}$ or the third internal power supply $+V_{DD2}$, $-V_{DD2}$ of the isolated power supply 122, and corresponding ground. Within the isolated power supply 122, a number of filter capacitors C1, C2, C3, C4, C5 are used to mitigate any noise, ripple, etc from the provisioned internal power supply. In FIG. 2, the filter capacitor C1 is connected between positive and negative outputs +VDC, −VDC of the converter U1a, which generates the first internal power supply $+V_{DD}$, $-V_{DD}$. The positive and negative outputs +VDC, −VDC of the converter U1a are connected to positive and negative inputs $+V_{IN}$, $-V_{IN}$ of the isolated DC-DC converter U1b, and to positive and negative inputs $+V_{IN}$, $-V_{IN}$ of the voltage regulator U1c. The isolated DC-DC converter U1b has three outputs, a positive output $+V_O$, a negative output $-V_O$, and a ground output GND. The second internal power supply $+V_{Iso}$, $-V_{Iso}$ and an isolated ground $GND_{Iso}$ are generated by these outputs. The filter capacitor C2 is connected between the positive output $+V_O$ and the ground output GND. The filter capacitor C3 is connected between the negative output $-V_O$ and the ground output GND. The voltage regulator U1c has three outputs, a positive output $+V_O$, a negative output $-V_O$, and a ground output GND connected to ground. The third internal power supply $+V_{DD2}$, $-V_{DD2}$ and a ground are generated by these outputs. The filter capacitor C4 is connected between the positive output $+V_O$ and ground. The filter capacitor C5 is connected between the negative output $-V_O$ and ground.

Returning to FIGS. 1A and 1B, the amplifier 114 receives the control signal 102a, 102b from one or both of the two terminals A and B of the interface connector 110 and conditions the received control signal to drive the isolation amplifier 120. In some embodiments, the amplifier 114 is implemented with a differential amplifier configuration using any suitable op-amp or other similar component(s). The isolation amplifier 120 effectively isolates the control signal(s) 102a, 102b input from the lighting controller 104/104a from other signals, such that any short-circuit or other such adverse signal conditions in an input stage of the interface circuit 100/100a will not be able to manifest at an output of the interface circuit 100/100a. The isolation amplifier 120 is implemented using, for example but not limited to, a transformer-based isolation barrier or an optical-based isolation barrier, although any suitable isolation techniques may be used. In some embodiments, each of the amplifier 114 and the isolation amplifier 120 is implemented with bipolar amplifiers, so that the input amplitude and polarity information are presented at the output of the isolation amplifier 120.

Figure 3:
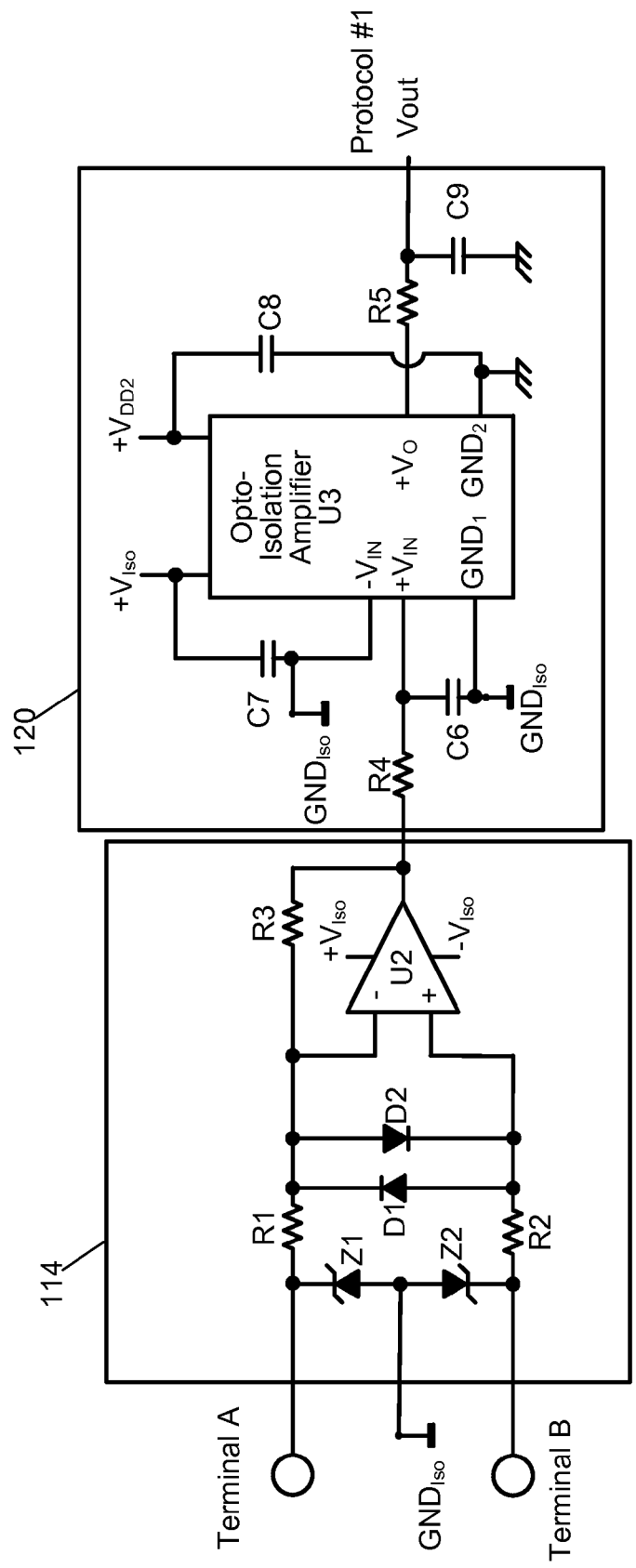
FIG. 3 illustrates an example configuration of an amplifier and an isolation amplifier of the lighting control interface circuits of FIGS. 1A and 1B according to embodiments disclosed herein.

In some embodiments, the amplifier 114 and the isolation amplifier 120 are configured as shown in FIG. 3. FIG. 3 shows the amplifier 114 implemented with a differential amplifier configuration that includes an op-amp U2, including an inverting input, a non-inverting input, and output, and two power terminals, along with resistors R1, R2, and R3, diodes D1 and D2, and Zener diodes Z1 and Z2. The Zener diodes Z1 and Z2 are connected in series between the two terminal A and B. The isolated ground $GND_{Iso}$ of the isolated power supply 122 is connected in between the Zener diodes Z1 and Z2. The diodes D1 and D2 are connected in parallel across the inverting input and the non-inverting input of the op-amp U2. The resistor R1 is connected in series between terminal A and the inverting input of the op-amp U2. The resistor R2 is connected in series between terminal B and the non-inverting input of the op-amp U2. The second internal power supply $+V_{Iso}$, $-V_{Iso}$ generated by the isolated power supply 122 is connected to the two power terminals of the op-amp U2. The resistor R3 is connected across the output of the op-amp U2 and the inverting input of the op-amp U2. The isolation amplifier 120 is implemented with an opto-isolation amplifier U3, along with resistors R4 and R5, and capacitors C6, C7, C8, and C9. The opto-isolation amplifier U3 includes at least five terminals. A first terminal $-V_{IN}$ and a first ground terminal $GND_1$ are each connected to the isolated ground $GND_{Iso}$ of the isolated power supply 122. The capacitor C7 is connected between the first terminal $-V_{IN}$ and the positive portion $+V_{Iso}$ of the second internal supply of the isolated power supply 122. The capacitor C6 is connected between a second terminal $+V_{IN}$ and the first ground terminal $GND_1$. The resistor R4 is connected between the capacitor C6 and the output of the op-amp U2 of the amplifier 114. A second ground terminal $GND_2$ is connected to ground. The capacitor C8 is connected between the second ground terminal $GND_2$ and the positive portion $+V_{DD2}$ of the third internal supply of the isolated power supply 122. The resistor R5 is connected to an output terminal $+V_O$ and to the capacitor C9. The capacitor C9 is also connected to ground. An output voltage Vout, representing the first protocol protocol #1 is taken from a point between the resistor R5 and the capacitor C9.

In operation, the op-amp U2 of the amplifier 114 receives a control signal (e.g., 0-10V or DALI control signal) and conditions the signal to drive the opto-isolation amplifier U3 of the isolation amplifier 120. The configuration of the op-amp U2 and the opto-isolation amplifier U3 means that the input amplitude and polarity information of the applied control signal will be presented at the output of the opto-isolation amplifier U3, i.e., at Vout. In some embodiments, the op-amp U2 is a TS912 op-amp by STMicroelectronics, and the opto-isolation amplifier U3 is a HCPL7510 iso-opto amplifier by Avago Technologies. In some embodiments, the resistors R1, R2, R3, and R4, and the capacitors C6, C7, C8, and C9 have the following values: R1 and R2=100KΩ, R3=2KΩ, R4=200Ω, and R5=1KΩ; C6=180 pF, C7 and C8=100 nF, and C9=10 nF. Of course, numerous other suitable component manufacturers and component types and component values may be, and in some embodiments are, used to implement the amplifier and the isolation amplifier, and any specific examples provided here merely illustrate one possible working configuration and are not intended to limit the claimed invention in any way. A lighting control interface circuit configured with such circuitry provides a number of features, including but not limited to: galvanic isolation from lighting controller; recognition of 0-10V signal reverse connection, such that when signal is reversed, minimum light output power may be applied; a 0-10V analog signal wherein 0V corresponds to minimum light and 10V corresponds to maximum light; current draw from control is ≤2.0 mA (which may be desirable, for example, for 0-10V control signals); and common mode noise voltage control by using the Zener diodes Z1 and Z2 and the op-amp U2 input protection (the diodes D1 and D2 and high input impedance of the op-amp U2).

Figure 4:
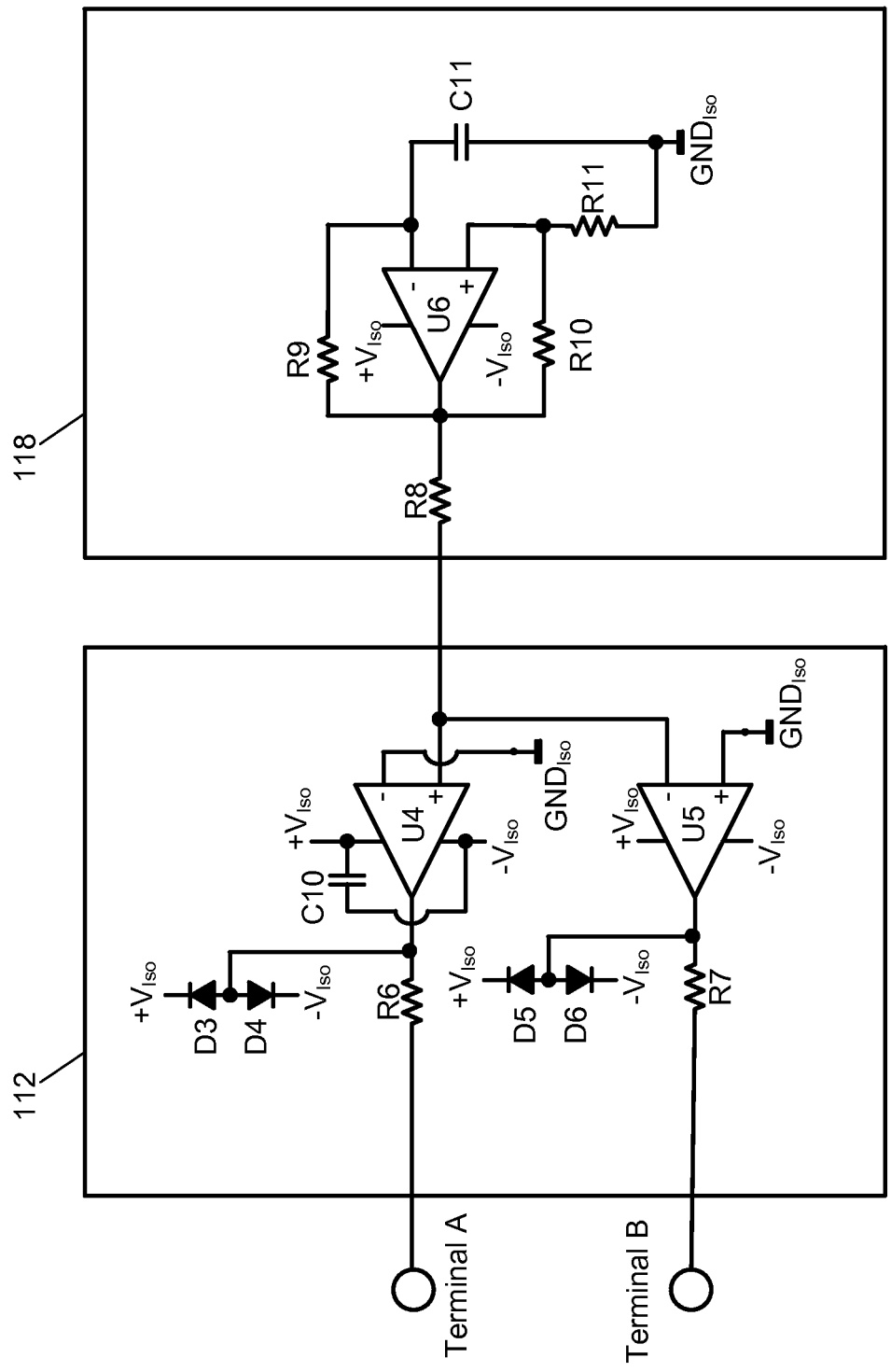
FIG. 4 illustrates an example configuration of a buffer and a signal generator of the lighting control interface circuits of FIGS. 1A and 1B according to embodiments disclosed herein.

Going back again to FIGS. 1A and 1B, the lighting control interface circuit 100/100a includes an on-board signal generator 118 and a buffer 112. As explained above, the signal generator 118 and the buffer 112 may be, and in some embodiments are, used to provide an alternative or dummy control signal to the two terminals A and B of the interface connector 110. Such a dummy control signal is provided so that when no actual control signal is present at either of the two terminals A and B, the MCU 126 will detect the unsuppressed signal of the on-board signal generator 118 and therefore be informed that no actual control signal is present at either or both of the two terminals A and B. FIG. 4 illustrates a possible configuration of the signal generator 118 and the buffer 112. As may be seen, the signal generator 118 is implemented with an oscillator configuration that includes an op-amp U6 with an inverting input, a non-inverting input, two power terminals, and an output, along with resistors R8, R9, R10, and R11, and a capacitor C11. The resistor R8 is connected to the output of the op-amp U6 and to a non-inverting input of an op-amp U4 of the buffer 112. The resistor R9 is connected between the output of the op-amp U6 and the inverting input of the op-amp U6. The resistor R10 is connected between the output of the op-amp U6 and the non-inverting input of the op-amp U6. The resistor R11 is connected between the non-inverting input of the op-amp U6 and the isolated ground $GND_{Iso}$ of the isolated power supply 122. The capacitor C11 is connected between the inverting input of the op-amp U6 and the isolated ground $GND_{Iso}$ of the isolated power supply 122. The second internal supply $+V_{Iso}$, $-V_{Iso}$ of the isolated power supply 122 is connected to the power terminals of the op-amp U6. The buffer 112 is implemented with a differential amplifier configuration that includes op-amps U4 and U5, each including an output, an inverting input, a non-inverting input, and two power terminals, along with resistors R6 and R7, a capacitor C10, and two pairs of serially connected diodes, D3 and D4, and D5 and D6. Each pair of serially connected diodes, D3 and D4, and D5 and D6, are configured such that an anode of each diode in the pair is connected to an anode of the other diode in the pair. The resistor R6 is connected between the output of the op-amp U4 and terminal A of the two terminals A and B. The anode to anode connection of the pair of serially connected diodes D3 and D4 is also connected to the output of the op-amp U4. The second internal supply $+V_{Iso}$, $-V_{Iso}$ of the isolated power supply 122 is connected to the power terminals of the op-amp U4, and the capacitor C10 is connected across the power terminals. The inverting input of the op-amp U4 is connected to the isolated ground $GND_{Iso}$ of the isolated power supply 122. The non-inverting input of the op-amp U4 is connected to the resistor R8 of the signal generator 118 and to the inverting input of the op-amp U5. The resistor R7 is connected between the output of the op-amp U5 and terminal B of the two terminals A and B. The anode to anode connection of the pair of serially connected diodes D5 and D6 is also connected to the output of the op-amp U5. The second internal supply $+V_{Iso}$, $-V_{Iso}$ of the isolated power supply 122 is connected to the power terminals of the op-amp U5. The second internal supply $+V_{Iso}$, $-V_{Iso}$ of the isolated power supply 122 is also connected to the cathode of each diode in the two pairs of serially connected diodes, D3 and D4, and D5 and D6.

In operation, the signal generator 118 generates a low frequency square wave (depending on the values of the resistors R8, R9, R10, and R11 and the capacitor C11), and the op-amps U4 and U5 of the buffer 112 buffer the square wave, but the outputs of the op-amps U4 and U5 have opposite polarity. Through the relatively high values of the resistors R6 and R7, the outputs of the op-amps U4 and U5 are applied to the two terminals A and B. If the two terminals A and B are connected to a control signal (for example but not limited to a 0-10V signal or a DALI signal), that control signal will override the square wave generated by the signal generator 118 with high output impedance (for example, the op-amps U4, U5, and U6, and the resistors R6 and R7). The output of the opto-isolation amplifier U3 in the isolation amplifier 120 presents the signal amplitude and polarity information of that control signal. On the other hand, if the input at the two terminals A and B is open (i.e., there is no control signal or signals received at one or both of the two terminal A and B), the output of the opto-isolation amplifier U3 in the isolation amplifier 120 presents the square wave.

In some embodiments, the op-amps U4, U5, and U6 are all TS912 op-amps by STMicroelectronics, the resistors R6 and R7 each have a value of 430KΩ, the resistors R8 and R11 each have a value of 10KΩ, the resistors R9 and R10 each have a value of 100KΩ, the capacitors C10 and C11 each have a value of 100 nF, and the diode pairs D3 and D4, and D5 and D6, are each implemented with a BAV99 silicon diode pair. Again, numerous other suitable component manufacturers and component types and component values may be, and in some embodiments are, used, and any specific examples provided herein merely illustrate one possible working configuration and are not intended to limit the claimed invention in any way. A lighting control interface circuit 100/100a configured with such signal generation capability provides a number of features, including recognition of input open condition, such that when no control signal (e.g., 0~10V, etc) is applied, a default light output signal (e.g., full light output power, or other desired default light output power) may then be provisioned by the microcontroller unit or other processor. As will be further appreciated in light of this disclosure, using a self-contained alternative signal source with high output impedance to apply a dummy or otherwise sacrificial test signal to the input terminals of the interface circuit to identify the conditions of no input signal connection may be carried out using signal types other than square waves (e.g., sine wave, saw tooth wave, or any other wave shape), and the claimed invention is not intended to be limited to any particular signal type or particular set of parameters. In short, any dummy signal may be, and in some embodiments is, used, so long as the processor of the interface circuit is able to detect the presence of the dummy signal when no control signal is applied.

Figure 5:
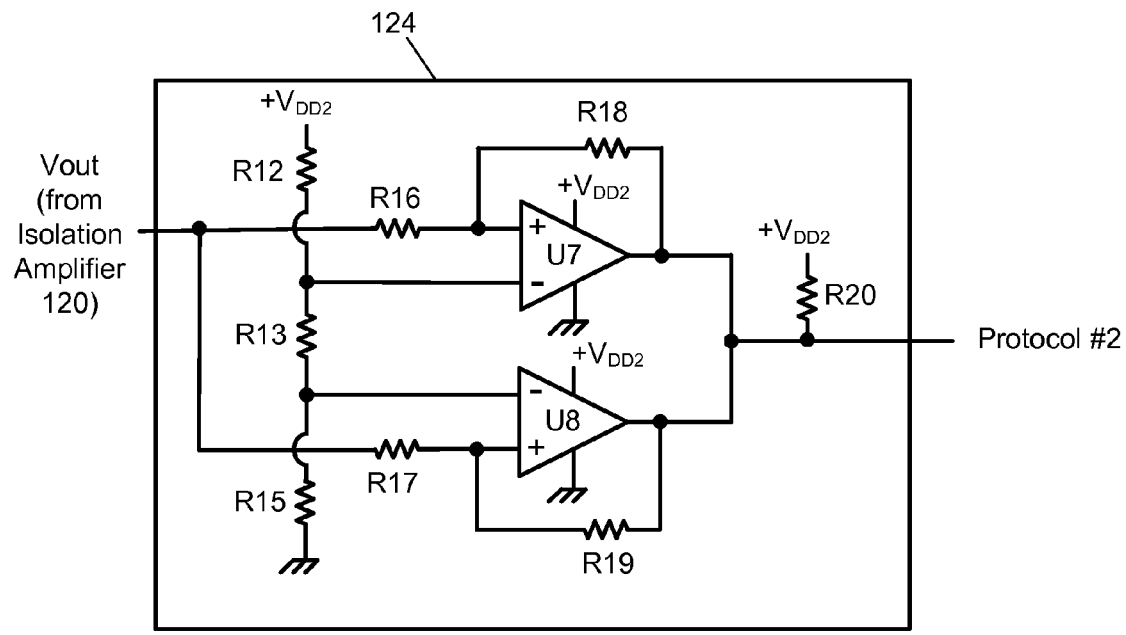
FIG. 5 illustrates an example configuration of a signal translator of the lighting control interface circuits shown in FIGS. 1A and 1B according to embodiments disclosed herein.

Again referring back to FIGS. 1A and 1B, the lighting control interface circuit 100/100a also includes the signal translator 124. In operation, when a lighting control signal or signals is applied to the two terminals A and B of the interface connector 110, the output of the isolation amplifier 120 presents the signal. For a 0-10V signal, the output of the isolation amplifier 120 presents the signal amplitude and polarity information. For a DALI control signal, the output of the isolation amplifier 120 presents the high or low and input polarity information of the DALI signal. The signal translator 124 may be, and in some embodiments is, configured to translate the output of the isolation amplifier 120 into a logic DALI signal, such as but not limited to a TTL or CMOS logic signal, or any other suitable lighting control signal. FIG. 5 shows one possible configuration of the signal translator 124. As may be seen, the signal translator 124 in FIG. 5 is implemented with a window comparator circuit formed of op-amps U7 and U8, each having an inverting input, a non-inverting input, an output, and two power terminals, along with resistors R12, R13, R15, R16, R17, R18, R19, and R20. The power terminals of each op-amp U7 and U8 are connected to the positive portion of the third internal supply +$V_{DD2}$ of the isolated power supply 122 and to ground. The resistors R12, R13, and R15 are connected in series between the positive portion of the third internal supply +$V_{DD2}$ of the isolated power supply 122 and ground. A connection point between the resistors R12 and R13 is connected to the inverting input of the op-amp U7. A connection point between the resistors R13 and R15 is connected to the inverting input of the op-amp U8. The resistors R16 and R17 are each connected to an input of the signal translator 124, which receives the output signal Vout from the isolation amplifier 120. The resistor R16 is also connected to the non-inverting input of the op-amp U7, and the resistor R17 is also connected to the non-inverting input of the op-amp U8. The resistor R18 is connected between the non-inverting input of the op-amp U7 and the output of the op-amp U7. The resistor R19 is connected between the non-inverting input of the op-amp U8 and the output of the op-amp U8. The outputs of the op-amps U7 and U8 and interconnected. The resistor R20 is connected between the interconnected outputs of the op-amps U7 and U8 and the positive portion of the third internal supply +$V_{DD2}$ of the isolated power supply 122. In operation, the signal translator 124 receives the output of the isolation amplifier 120 and translates it into, for example, a logic DALI signal, at its output (i.e., the interconnected outputs of the op-amps U7 and U8). Note that an output side of the isolated amplifier 120 has the same power supply as the op-amps U7 and U8, which in FIG. 5 is the positive portion of the third internal supply +$V_{DD2}$ of the isolated power supply 122.

In some embodiments, the op-amps U7 and U8 are implemented with an LM2903 dual differential comparator by STMicroelectronics, the resistors R12, R13, R15, R16, R17, and R20 each have a value of 10KΩ, and the resistor R18 and R19 each have a value 1 MΩ. Again, numerous other suitable component manufacturers and component types and component values may be, and in some embodiments are, used, and any specific examples provided here merely illustrate one possible configuration and are not intended to limit the claimed invention in any way. A lighting control interface circuit configured with such signal translation capability, along with the functionality described in reference to FIG. 4, provides a number of features and capabilities. For instance, components intended to process one particular control signal are able to withstand the presence of a different type of control signal applied to one of the two input terminals A and B of the interface circuit 100/100a, including the full range of such a particular control signal. Thus, such an interface circuit is capable of receiving, for example, either a DALI or a 0-10V control signal on the same input terminal(s), and is further capable of at least one or more of open input recognition, input linearity, and reverse and off-range recognition.

Figure 6:
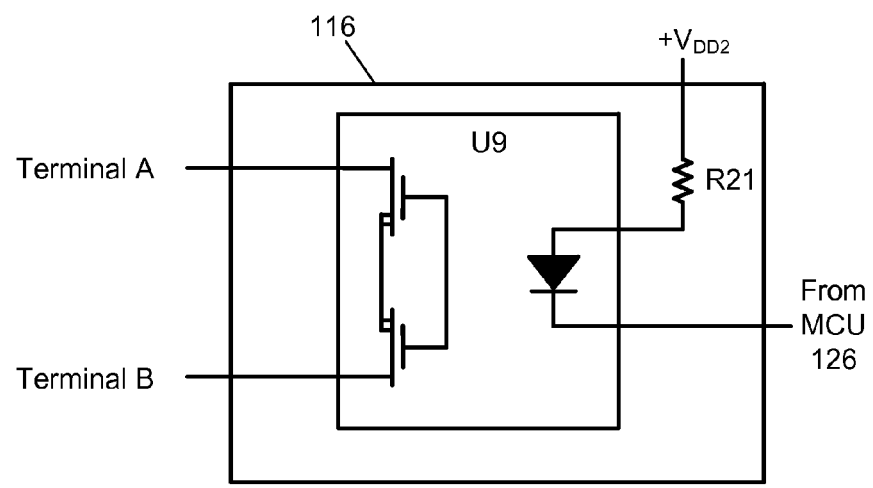
FIG. 6 illustrates a transmitter of the lighting control interface circuits of FIGS. 1A and 1B according to embodiments disclosed herein.

Referring yet again back to FIGS. 1A and 1B, the lighting control interface circuit 100/100a includes the transmitter 126. The transmitter 126 allows for lighting control standards that use bidirectional communication from and to a lighting controller to be used by the interface circuit 100/100a. FIG. 6 shows a transmitter 116 in one possible configuration for this purpose. The transmitter 116 of FIG. 6 is implemented with a photo-MOS relay circuit U9 and a resistor 21. The photo-MOS relay circuit U9 includes four terminals, two of which are connected to the two input terminals A and B, one of which is connected to the resistor R21, and the remaining of which is connected to the MCU 126. The resistor R21 is also connected to the positive portion of the third internal supply +$V_{DD2}$ of the isolated power supply 122, from which the transmitter 116 receives power. Thus, the transmitter 116 has the same power supply as the signal translator 124. The transmitter 116, in operation, couples responses and other information from the MCU 126 back to the lighting controller 104/104a via the interface connector 110. Note that the MCU 126 may, and in some embodiments does, set communication timing, so that a response or responses sent back to the lighting controller 104/104a do not interfere with the receipt of one or more control signals being received on the two input terminals A and B. In some embodiments, the transmitter 116 is switched in and out of circuit by the MCU 126, if so desired. Numerous other bidirectional communication schemes may be, and in some embodiments are, used, and the claimed invention is not intended to be limited to any particular one. Of course, some embodiments do not include bidirectional communication capability.

Still again referring back to FIGS. 1A and 1B, the lighting control interface circuit 100/100a includes an MCU 126, which may be, and in some embodiments is, any suitable processor and/or microprocessor capable of carrying out the various functionalities described throughout. In general, MCU 126 is able to receive one or more inputs (such as but not limited to an output signal associated with a first lighting protocol, protocol #1, and an output signal associated with a second lighting protocol, protocol #2), and to generate one or more output drive signals, which are provided to a ballast/driver circuit 150 that is connected to the interface circuit 100 or is a part of the interface circuit 100a. The one or more output drive signals may be, and in some embodiments are, for example but not limited to, a pulse width modulated (PWM) dimming signal or other desired lighting control signal. In some embodiments, the MCU 126 is configured to respond to requests of the lighting controller 104/104a and/or other module requests by way of the transmitter 116, as previously discussed. The MCU 126 includes a number of input/output ports capable of receiving and outputting signals as described throughout, as well as a number of embedded routines for interrogating received lighting control signals and generating appropriate output drive signals. The MCU 126 may, and in some embodiments does, include other functionality, such as but not limited to analog-to-digital converters (ADCs) for processing analog inputs, voltage measuring capability (e.g., $V_{DC}$, $V_{average}$, $V_{peak}$ and/or $V_{peak-to-peak}$), and memory for storing signal data and/or other data, and/or embedded routines and/or other instructions to be executed by the MCU 126. In some embodiments, the MCU 126 is implemented in hardware, such as with gate-level logic or purpose-built silicon. In some embodiments, the MCU 126 is implemented with any combination of hardware, software, and/or firmware so as to provide the various functionalities as described.

Figure 7:
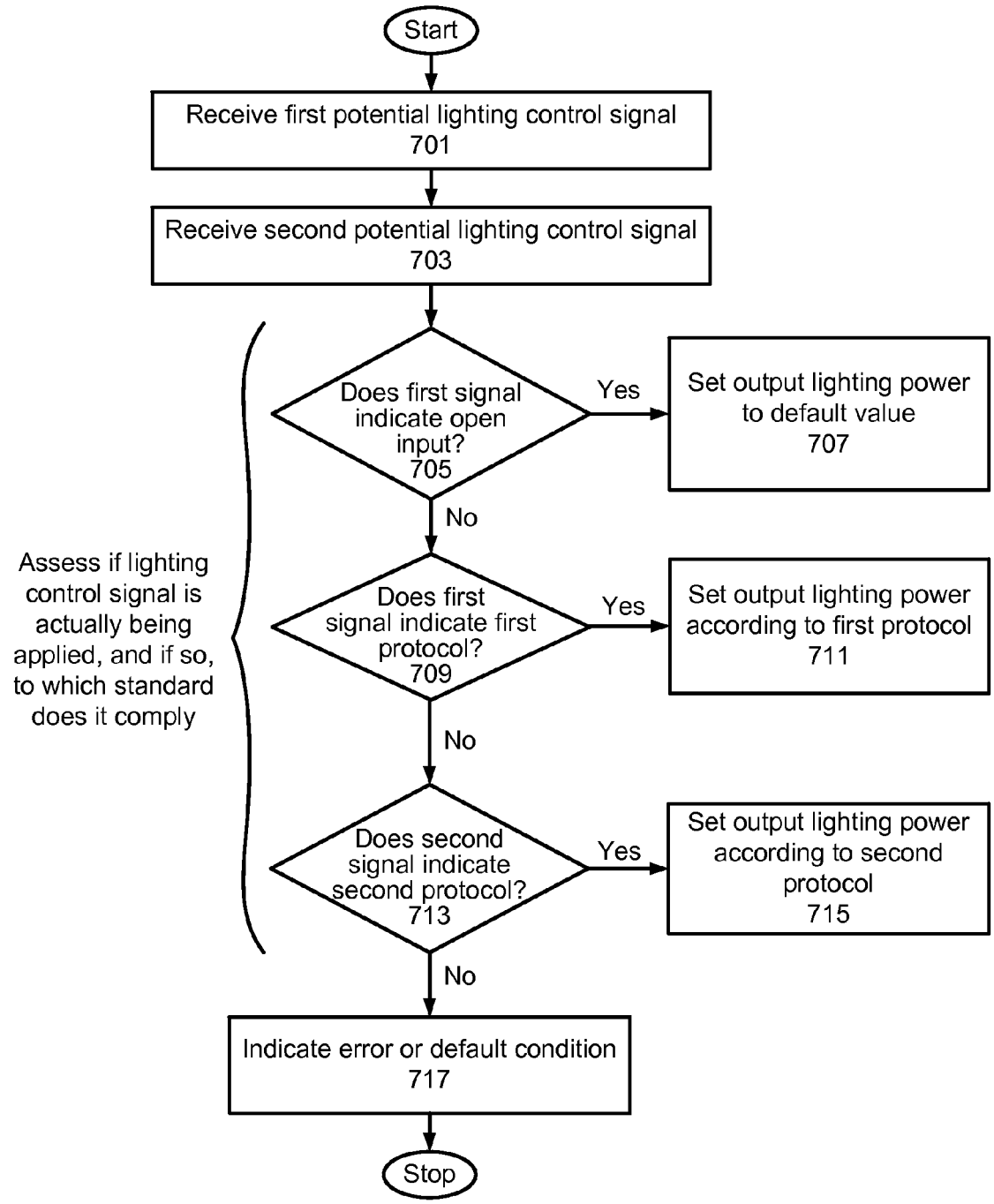
FIG. 7 is a flowchart of methods carried out by one of the lighting control interface circuits of FIGS. 1A and 1B according to embodiments disclosed herein.

A flowchart of a method of processing lighting control signals is illustrated in FIG. 7. The elements of the flowchart are herein denoted "processing blocks" and represent computer software instructions or groups of instructions. Alternatively, the processing blocks represent steps performed by functionally equivalent circuits such as a digital signal processor circuit or an application specific integrated circuit (ASIC). The flowchart does not depict the syntax of any particular programming language. Rather, the flowchart illustrates the functional information one of ordinary skill in the art requires to fabricate circuits or to generate computer software/firmware to perform the processing required in accordance with embodiments. It should be noted that many routine program elements, such as initialization of loops and variables and the use of temporary variables, are not shown. It will be appreciated by those of ordinary skill in the art that unless otherwise indicated herein, the particular sequence of steps described is illustrative only and may be varied without departing from the spirit of the invention. Thus, unless otherwise stated, the steps described below are unordered, meaning that, when possible, the steps may be performed in any convenient or desirable order. More specifically, FIG. 7 illustrates a method that may be carried out by the MCU 126 or other processor of the lighting control interface circuit 100/100a, in accordance with embodiments.

The MCU receives a first potential lighting control signal, step 701, and receives a second potential lighting control signal, step 703. Referring once more back to FIGS. 1A and 1B, for example, the first potential lighting control signal and the second potential lighting control signal may be, and in some embodiments are, the result of a lighting control signal being applied to the two terminals A and B, such as but not limited to a 0-10V or a DALI compliant signal or any other signal that is compliant with a given lighting protocol. Alternatively, the first and second potential lighting control signals received may be the result of no lighting control signal being applied to the two terminals A and B (i.e., an open input condition). In some embodiments, the first and second potential lighting control signals are received simultaneously with at least some overlap in the receiving time period, and in some embodiments, sequentially with no overlap.

The method continues with determining if the first signal indicates an open input, step 705. To recognize the open input condition, a signal generator and a buffer, such as but not limited to the signal generator 118 and the buffer 112, may be and in some embodiments are used, as previously explained. In some embodiments, the signal generator is configured to generate a 270 HZ square wave ±5V, although any suitable dummy control signal may be and in some embodiments is used, and the dummy control signal shape, frequency, and/or amplitude may vary. The buffer 112 may be, and in some embodiments is, used to drive the two terminals A and B through relatively high value resistors. In general, any impedance value may be used that is substantially higher than the output impedance of the lighting controller 104/104a connected to the interface circuit 100/100a, or that otherwise allows suppression of the dummy control signal when an actual control signal is present at one or more of the two terminals A and B. With reference to FIGS. 3 and 4, the outputs of the op-amps U4 and U5 of the buffer 112 are in opposite phase. If the input terminal open condition is true, the lighting control interface circuit 100/100a will output, as a first lighting protocol protocol #1, received by the MCU 126, the square wave with an average voltage of about zero, and the peak-to-peak value at the output is a non-zero (substantially −1V here, but other embodiments will provide different values). The MCU 126 may, and in some embodiments does, measure this output and make the determination of step 705 based on measured or otherwise computed results. If the first signal indicates an open input, then the method continues with setting output lighting power to a default value, step 707. The default value may be, and in some embodiments is, a max power, a min power, or any other acceptable predetermined power level.

If the first signal does not indicate an open input condition, then it is determined if the first signal indicates a first protocol, step 709. Referring to the use of a 270 Hz square wave signal generator again, if the two terminals A and B are connected to a 0-10V control signal, then the 270 Hz square wave will be suppressed and disappeared at the output of the isolation amplifier 120 (i.e., the first lighting protocol protocol #1 received by the MCU 126), because that 0-10V control signal has relatively low impedance (e.g., output impedance of a 0-10V compliant lighting controller is 1000) compared to the 430KΩ output impedance associated with the 270 Hz square wave generator.

In more detail, and with respect to the determinations at steps 705 and 709 in the context of FIGS. 3 and 4, the output dynamic range of the isolation amplifier 120 is largely based on the polarities of the applied lighting control signal. If the lighting control signal is connected in its non-inverted state, the output range of the isolation amplifier 120 is above $V_{DD2}/2$, which may be 2.5V in some embodiments (assuming $V_{DD2}$=5.0 VDC). If the lighting control signal is connected in reversed polarity, the output signal range at the output of the isolation amplifier 120 is below 2.5V. Both these conditions may therefore be detected by the MCU 126. If a lighting control signal is not connected to the two terminals A and B, the output signal of the isolation amplifier 120 is, for example, a dummy control signal, such as but not limited to the 270 HZ square wave signal described above that alternates up and down across 2.5V. In such embodiments, this manifestation of the dummy control signal, which is output by the isolation amplifier 120, is then low-pass filtered (via the resistor R5 and the capacitor C9) and fed to an ADC of the MCU 126, so that the signal condition is then recognized or otherwise identified by the MCU 126. Thus, the MCU 126 is configured to recognize the polarity and amplitude of the input voltage of signal applied at the two terminals A and B, such as whether the voltage is within ±10V or other such protocol-based bipolar voltage range. The MCU 126, in some embodiments, is configured to test for an open input condition by determining that the output of the isolation amplifier 120 has an average output voltage of substantially zero (within an acceptable tolerance, such as +/−250 mV), and an absolute voltage that is a significant non-zero (also within an acceptable tolerance, such as +/−5%). As will be appreciated, other output parameters that reflect a unique manifestation that may be detected by the MCU 126 may be, and in some embodiments are, used as well, or alternatively.

If the first signal indicates a first protocol, then the method continues with setting output lighting power according to the first protocol (e.g., 0-10V protocol, or other desired standard), step 711. In other words, the output drive signal provided is set according to the first lighting protocol. On the other hand, if the first signal does not indicate the first protocol, then the method continues with determining if the second signal indicates a second protocol, step 713. This is carried out in a similar fashion as described with reference to the determination of the first protocol, except that the measured or computed parameters would be those uniquely indicative of the second protocol. For example, the requirement of a DALI-compliant interface input voltage is in the range of ±22.5V, with rising and falling edges of less than 100 μs. These requirements may also be configured into or otherwise met by first protocol (e.g., 0-10V) interface portion of the interface circuit, which also meets the galvanic isolation requirement of DALI. As previously explained, a DALI control signal may effectively be extracted or otherwise recovered from the 0-10V portion of the control signal interface circuit using the signal translator 124. Thus, the DALI portion of the interface circuit receives its input from the output of the isolation amplifier 120. If a DALI control signal is indeed being applied at the two terminals A and B, then this output will be a DALI signal in reverse polarity. The signal translator 124 adjusts the levels of the output signal to provide a DALI signal having appropriate logic levels. The positive feedback of the op-amps U7 and U8 introduces hysteresis to improve edges of the DALI signal into appropriate logic levels. The MCU 126 may be, and in some embodiments is, configured, for instance, to correct the polarity and recognize the DALI message. Thus, if the second signal indicates a second protocol, then the method continues with setting output lighting power according to the second protocol (e.g., DALI protocol, or other desired standard), step 715. On the other hand, if the second signal does not indicate a second protocol, then the process may continue with, for example, indicating an error or default condition (e.g., no light, error message, etc), step 717.

The MCU 126 or other suitable processing environment is capable of assessing if a lighting control signal is actually being applied to one or both of the two terminals A and B of the interface connector 110, and if so, determining with which standard it complies with. The MCU 126 assesses the output signals from the interface circuit and makes a determination as to which one is most likely a manifestation of a supported lighting control protocol signal, or an open input. The order and manner in which the various output signals are assessed need not be limited to the examples provided herein.

Numerous variations will be apparent in light of this disclosure. For instance, in some embodiments, note that the interface may only be for receiving one type of lighting control protocol (rather than multiple types). In such cases, the MCU may be used, for example, to determine when an actual lighting control signal compliant with that protocol is applied or when there is no lighting control signal applied. Likewise, other embodiments may include additional or less functionality. For instance, while this embodiment allows for bi-directional communication between the lighting controller and the lighting control interface circuit (using the transmitter), other embodiments need not include such functionality. Moreover, note that other embodiments may integrate one or more functional modules shown into other modules, as demonstrated in FIG. 1B. In other embodiments, the lighting control interface circuit may be integrated directly into the light controller module. Alternatively, some of the lighting control interface circuit may be integrated into the lighting controller, and other portions of the lighting control interface circuit may be integrated into the ballast/light driver module. The degree of integration may vary from one embodiment to the next.

The methods and systems described herein are not limited to a particular hardware or software configuration, and may find applicability in many computing or processing environments. The methods and systems may be implemented in hardware or software, or a combination of hardware and software. The methods and systems may be implemented in one or more computer programs, where a computer program may be understood to include one or more processor executable instructions. The computer program(s) may execute on one or more programmable processors, and may be stored on one or more storage medium readable by the processor (including volatile and non-volatile memory and/or storage elements), one or more input devices, and/or one or more output devices. The processor thus may access one or more input devices to obtain input data, and may access one or more output devices to communicate output data. The input and/or output devices may include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, where such aforementioned examples are not exhaustive, and are for illustration and not limitation.

The computer program(s) may be implemented using one or more high level procedural or object-oriented programming languages to communicate with a computer system; however, the program(s) may be implemented in assembly or machine language, if desired. The language may be compiled or interpreted.

As provided herein, the processor(s) may thus be embedded in one or more devices that may be operated independently or together in a networked environment, where the network may include, for example, a Local Area Network (LAN), wide area network (WAN), and/or may include an intranet and/or the internet and/or another network. The network(s) may be wired or wireless or a combination thereof and may use one or more communications protocols to facilitate communications between the different processors. The processors may be configured for distributed processing and may utilize, in some embodiments, a client-server model as needed. Accordingly, the methods and systems may utilize multiple processors and/or processor devices, and the processor instructions may be divided amongst such single- or multiple-processor/devices.

The device(s) or computer systems that integrate with the processor(s) may include, for example, a personal computer(s), workstation(s) (e.g., Sun, HP), personal digital assistant(s) (PDA(s)), handheld device(s) such as cellular telephone(s) or smart cellphone(s), laptop(s), handheld computer(s), or another device(s) capable of being integrated with a processor(s) that may operate as provided herein. Accordingly, the devices provided herein are not exhaustive and are provided for illustration and not limitation.

References to "a microprocessor" and "a processor", or "the microprocessor" and "the processor," may be understood to include one or more microprocessors that may communicate in a stand-alone and/or a distributed environment(s), and may thus be configured to communicate via wired or wireless communications with other processors, where such one or more processor may be configured to operate on one or more processor-controlled devices that may be similar or different devices. Use of such "microprocessor" or "processor" terminology may thus also be understood to include a central processing unit, an arithmetic logic unit, an application-specific integrated circuit (IC), and/or a task engine, with such examples provided for illustration and not limitation.

Furthermore, references to memory, unless otherwise specified, may include one or more processor-readable and accessible memory elements and/or components that may be internal to the processor-controlled device, external to the processor-controlled device, and/or may be accessed via a wired or wireless network using a variety of communications protocols, and unless otherwise specified, may be arranged to include a combination of external and internal memory devices, where such memory may be contiguous and/or partitioned based on the application. Accordingly, references to a database may be understood to include one or more memory associations, where such references may include commercially available database products (e.g., SQL, Informix, Oracle) and also proprietary databases, and may also include other structures for associating memory such as links, queues, graphs, trees, with such structures provided for illustration and not limitation.

References to a network, unless provided otherwise, may include one or more intranets and/or the internet. References herein to microprocessor instructions or microprocessor-executable instructions, in accordance with the above, may be understood to include programmable hardware.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

What is claimed is:

1. A lighting control interface circuit, comprising:
    an interface connector configured to receive a lighting control signal;
    a control signal processing circuit operatively coupled to the interface connector and having a first processing section that provides a first output signal at a first output and a second processing section operatively coupled to the first output and configured to provide a second output signal at a second output; and
    a processor configured to receive the first output signal via the first output and to determine if a lighting control signal is being applied at the interface connector based on the first output signal.

2. The lighting control interface circuit of claim 1, wherein the processor is further configured to determine if a lighting control signal applied at the interface connector complies with one of a first lighting control protocol and a second lighting control protocol.

3. The lighting control interface circuit of claim 1, further comprising:
    a signal generator circuit operatively coupled to the interface connector and configured to provide a dummy control signal at an output of the control signal processing circuit as an indicator to the processor that no lighting control signal is currently applied to the interface connector.

4. The lighting control interface circuit of claim 3, wherein the processor is further configured to detect the dummy control signal at an output of the control signal processing circuit.

5. The lighting control interface circuit of claim 3, wherein a lighting control signal applied to the interface connector overrides the dummy control signal.

6. The lighting control interface circuit of claim 3, wherein the processor is configured to detect the dummy control signal at the first output when no lighting control signal is applied to the interface connector.

7. The lighting control interface circuit of claim 1, wherein the processor is further configured to receive the second output signal and to determine if the second output signal complies with a lighting control protocol in a plurality of lighting control protocols.

8. The lighting control interface circuit of claim 1, wherein the first processing section comprises an isolation amplifier, and wherein the lighting control interface circuit further comprises an isolated power supply configured to provide power to one side of the isolation amplifier.

9. The lighting control interface circuit of claim 1, further comprising:

a transmitter communicatively coupled between the processor and the interface connector, and configured to allow the processor to communicate with a lighting controller connected to the interface connector.

10. A lighting control interface circuit, comprising:
an interface connector configured to receive a lighting control signal that is compliant with a lighting control protocol in a plurality of lighting control protocols;
a control signal processing circuit operatively coupled to the interface connector, wherein the control signal processing circuit comprises an isolation amplifier configured to provide a first output signal at a first output, and a signal translator operatively coupled to the first output and configured to provide a second output signal at a second output;
a processor configured to receive the first and second output signals and to determine if a lighting control signal applied at the interface connector complies with a lighting control protocol in the plurality of lighting control protocols; and
a signal generator circuit operatively coupled to the interface connector and configured to provide a dummy control signal at an output of the control signal processing circuit as an indicator to the processor that no lighting control signal is currently applied to the interface connector.

11. The lighting control interface circuit of claim 10, wherein the processor is further configured to detect the dummy control signal at an output of the control signal processing circuit.

12. The lighting control interface circuit of claim 10, wherein the processor is configured to detect the dummy control signal at the first output when no lighting control signal is applied to the interface connector.

13. The lighting control interface circuit of claim 10, further comprising at least one of:

an isolated power supply configured to provide power to one side of the isolation amplifier; and
a transmitter communicatively coupled between the processor and the interface connector configured to allow the processor to communicate with a lighting controller connected to the interface connector.

14. A method of interfacing lighting controls, comprising:
receiving a first signal potentially representative of a first lighting control signal;
receiving a second signal potentially representative of a second lighting control signal;
determining if either of the first and second signals complies with a first lighting control protocol or a second lighting control protocol; and
determining that a dummy control signal is manifesting in at least one of the first and second signals, thereby indicating that no lighting control signal is being applied.

15. The method of claim 14, wherein in response to determining that a dummy control signal is manifesting in at least one of the first and second signals, the method further comprises:
setting output lighting power according to a pre-established value.

16. The method of claim 14, wherein in response to determining the first signal complies with a first lighting control protocol, the method further comprises:
setting output lighting power according to the first lighting control protocol.

17. The method of claim 14, wherein in response to determining the second signal complies with a second lighting control protocol, the method further comprises:
setting output lighting power according to the second lighting control protocol.

* * * * *